US009275888B2

(12) United States Patent
Riou (10) Patent No.: US 9,275,888 B2
(45) Date of Patent: Mar. 1, 2016

(54) TEMPORARY SUBSTRATE, TRANSFER METHOD AND PRODUCTION METHOD

(75) Inventor: Gregory Riou, Crolles (FR)

(73) Assignee: Soitec, Bernin (FR)

(*) Notice: Subject to any disclaimer, the term of this patent is extended or adjusted under 35 U.S.C. 154(b) by 1040 days.

(21) Appl. No.: 13/174,363

(22) Filed: Jun. 30, 2011

(65) Prior Publication Data
US 2012/0015498 A1 Jan. 19, 2012

Related U.S. Application Data

(63) Continuation-in-part of application No. 12/897,409, filed on Oct. 4, 2010, now abandoned.

(30) Foreign Application Priority Data

Jul. 15, 2010 (FR) ..................... 10 55767

(51) Int. Cl.
H01L 21/30 (2006.01)
H01L 21/46 (2006.01)
H01L 21/683 (2006.01)

(52) U.S. Cl.
CPC ..... *H01L 21/6835* (2013.01); *H01L 2221/6835* (2013.01); *H01L 2221/68318* (2013.01); *H01L 2221/68327* (2013.01); *H01L 2221/68368* (2013.01); *H01L 2221/68381* (2013.01); *Y10T 428/24942* (2015.01)

(58) Field of Classification Search
USPC ................. 438/149–199, 285, 455–479, 634; 257/74, 507, E21.324, E21.335, 257/E21.567; 428/150, 212, 323, 634
See application file for complete search history.

(56) References Cited

U.S. PATENT DOCUMENTS

| 6,071,809 | A | 6/2000 | Zhao ............................. 438/634 |
| 6,821,826 | B1 | 11/2004 | Chan et al. .................... 438/150 |
| 2004/0009683 | A1* | 1/2004 | Hiraoka et al. ................. 439/75 |
| 2004/0222500 | A1 | 11/2004 | Aspar et al. .................... 257/629 |
| 2004/0252559 | A1 | 12/2004 | Gupta ........................... 365/199 |
| 2008/0026564 | A1* | 1/2008 | Frohberg et al. .............. 438/637 |
| 2008/0038540 | A1 | 2/2008 | Hirayama et al. ............ 428/323 |

(Continued)

FOREIGN PATENT DOCUMENTS

| EP | 1 889 887 A1 | 2/2008 |
| FR | 2 866 982 A1 | 9/2005 |

OTHER PUBLICATIONS

International Search Report & Written Opinion, PCT/EP2011/061779, mailed Sep. 1, 2011.
French Search Report Application No. 1055767, dated Feb. 22, 2011.

(Continued)

*Primary Examiner* — Charles Garber
*Assistant Examiner* — Abdulfattah Mustapha
(74) *Attorney, Agent, or Firm* — TraskBritt (57) ABSTRACT

Temporary substrates may include a bonding surface prepared for receiving an additional substrate that will transfer a thin layer. Such substrates may include a principal part or support and a surface layer thereon with the surface layer having a plurality of inserts therein. The inserts are made of a material having a coefficient of thermal expansion that is significantly different from that of the material constituting the surface layer. Processing methods for transferring a selected portion of an original substrate may involve such temporary substrates and productions methods may produce such temporary substrates.

12 Claims, 7 Drawing Sheets

(56) References Cited

U.S. PATENT DOCUMENTS

2009/0001504 A1* 1/2009 Takei et al. .................. 257/507
2010/0261300 A1* 10/2010 Tu et al. .......................... 438/29

OTHER PUBLICATIONS

Topol, Anna W. et al., "3D Fabrication Options for High-Performance CMOS Technology", Wafer Level 3-D ICs Process Technology, Tan-Gutmann-Reif Editors, pp. 197-217.

* cited by examiner

TEMPORARY SUBSTRATE, TRANSFER METHOD AND PRODUCTION METHOD

CROSS-REFERENCE TO RELATED APPLICATION

This application is a continuation-in-part of U.S. patent application Ser. No. 12/897,409, filed Oct. 4, 2010, the entire content of which is expressly incorporated herein by reference thereto. This application claims priority to French Patent Application Serial No. FR1055767, filed Jul. 15, 2010.

TECHNICAL FIELD

The present disclosure relates to the field of temporary substrates used in the semiconductor industry.

BACKGROUND

Semiconducting structures serve as the basis for the electronics industry. In order to improve performance, methods have been developed for more and more increasing the density of circuits per unit area. However, a physical limit is being approached. It is for this reason that three-dimensional integration methods have appeared. Instead of always reducing the size of circuits, it is sufficient to stack them in 3D structures and to connect them by vertical interconnections.

The production of these types of structures requires the successive transfer of the layers of which they are made. These layers are, in point of fact, produced separately on specific substrates called "original substrates." It is then necessary, in order to transfer them in the right direction onto their final substrate, to use a temporary substrate, also called a "sacrificial substrate."

Figure 1:
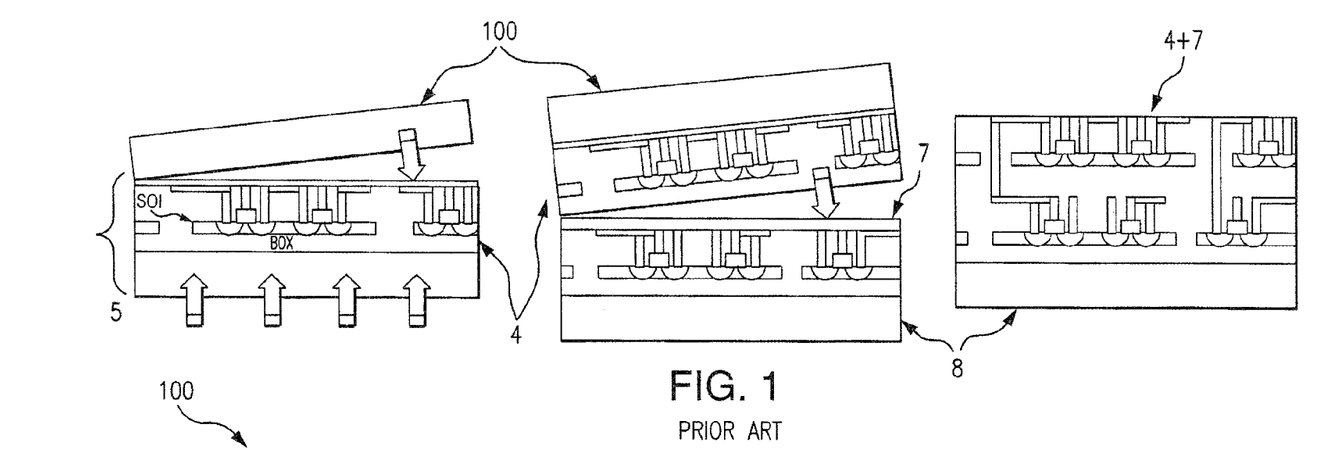
FIG. 1, previously described, shows three steps of a known use of a temporary substrate for a layer transfer.

The steps of an example of such a transfer are shown in FIG. 1. A temporary substrate 100 is attached to the topside of a layer 4 to be transferred, and part of an original substrate 5 on which the layer 4 was formed is then removed. The layer 4 is attached to a final substrate 8, covered as the case may be with one or more other layers 7 in the case of a 3D structure. Finally, the temporary substrate 100 is demounted.

Other applications exist for temporary substrates like, for instance, for mechanically supporting a semiconductor substrate while this substrate is processed (thinning operations, interconnection and/or vias formation, deposition of functional layers . . . ). Such temporary substrates and applications are described in U.S. Patent Application Publication No. 2004/222500.

One difficulty lies in the final detachment of the temporary substrate 100. A first technique called "laser lift-off" requires the use of a transparent substrate and an adhesive material that is sensitive to laser excitation. Another technique, described in U.S. Patent Application Publication No. 2004/222500 mentioned above, proposes the use of a rough temporary support that may be detached by a final mechanical and/or chemical action.

These solutions give satisfaction but remain very slow to process: the larger the substrate, the longer the detachment time. Although for 100 mm diameter substrates the detachment time may be acceptable, this detachment time proves to be much too long for profitable industrial use for substrates having diameters of 200 mm, 300 mm, or more.

European patent application EP 1889887 discloses a temporary substrate with an adhesive layer incorporating thermally expandable microspheres, but the temporary substrate described in this document cannot be used for a processing step that requires a temperature greater than 140° C. Additionally, the nature of the adhesive layer and the uncontrolled disposition of the microspheres into the adhesive layer does not meet the requirements of providing a sufficiently high adhesion during processing and enabling the controlled detachment of the substrate after processing. This is particularly true if the processing steps are exerting high levels of stress on the attached assembly, as is the case with grinding or polishing operations.

Accordingly, improvements are needed over these prior art processes, and these are now provided by this disclosure.

BRIEF SUMMARY

The present disclosure advantageously provides a temporary substrate facilitating final detachment, while eliminating the risk of premature detachment. This temporary substrate makes it possible to gain processing time by shortening the time necessary for detachment. This temporary substrate does not comprise adhesive material that would degrade if exposed to the required thermal treatment, and thus can sustain temperatures greater than 200° C.

In particular, the disclosure relates, according to a first feature, to a temporary substrate for the processing of an original substrate, characterized in that it comprises a surface layer having a plurality of inserts therein, the inserts being made of a material having a coefficient of thermal expansion that is significantly different from that of the material constituting the rest of the surface layer.

By "processing" of an original substrate, it is meant, in particular, the formation of a thin layer from the original substrate, for example, for transferring it to a final substrate.

The presence of these inserts with a different coefficient of thermal expansion means that by heating the structure before detachment, cavities appear at the interface between the temporary substrate substrate, according to the disclosure, and the original substrate. The area of attachment is thus reduced, which, in turn, brings about a considerable reduction in the overall adhesion and easy detachment of the thin layer.

In the temporary substrate according to the disclosure, a local debonding is thermally triggered that reduces the total surface energy, thus permitting a controlled detachment of the original substrate after processing. While the assembly is exposed to a temperature that is less than the trigger or full detachment temperature, the total surface energy can reach a value as high as 800 mJ/m$^2$ or even 1000 mJ/m$^2$, levels that are sufficient to withstand the most aggressive mechanical processing (e.g., back side grinding).

The disclosure also provides other advantageous non-limiting features:
- the surface layer covers the principal part of the temporary substrate, the principal part consisting of a material chosen from at least one of the following materials: Si, SiC, SiGe, glass, a ceramic, or a metal alloy;
- the surface layer is made of a silicon oxide;
- the surface layer presents a roughness below 10 nm, preferably below 5 nm;
- the inserts consist of copper;
- the inserts are distributed in the surface layer in a regular pattern;
- the inserts are distributed in a checkered pattern;
- the inserts are separated two-by-two by a distance equivalent to their width;
- the width of the inserts and/or their spacing lies between 250 and 500 µm;
- the inserts are covered by a thickness of the material of the surface layer less than 5000 Å but by at least 100 Å.

According to a second feature, the disclosure relates to a method for processing an original substrate on a temporary substrate according to the first feature of the disclosure, comprising the steps of:

attachment of the upper face of the original substrate to the temporary substrate;

processing of the original substrate;

heat treatment bringing about the formation of detachment zones between the upper face of the original substrate and the temporary substrate;

detachment of the zones of the surface of the temporary substrate that are still attached to the upper face of the original substrate.

Other advantageous non-limiting features of the method includes:

the step of processing of the original substrate comprises the step of removing at least part of the thickness of the original substrate to form a thin layer;

the removing step is performed by mechanical and/or chemical action;

the detachment step comprises a mechanical action;

the detachment step comprises application of a chemical etchant;

the attachment step comprises a heat treatment at a temperature below the temperature of the detachment heat treatment;

the method further comprises the step of attaching the processed face of the processed original substrate to a final substrate.

According to a third feature, the disclosure relates to a method for producing a temporary substrate according to the first feature of the disclosure, comprising the steps of:

depositing the surface layer on a principal part;

etching the surface layer to form cavities thereon;

depositing a layer of the material constituting the inserts so as to fill the cavities;

mechano-chemical polishing of the layer of the material constituting the inserts until the material of the surface layer is revealed;

depositing a thin layer of the material of the surface layer so as to cover the inserts.

According to other advantageous non-limiting features:

the material of the surface layer is deposited by plasma-enhanced chemical vapor deposition.

BRIEF DESCRIPTION OF THE DRAWINGS

Other features and advantages of the present disclosure will become apparent on reading the following description of a preferred embodiment. This description will be given with reference to the appended drawings in which.

DETAILED DESCRIPTION

In a preferred embodiment, the disclosure includes a temporary substrate having a bonding surface prepared for receiving an additional substrate that will transfer a thin layer. This temporary substrate comprises a principal part or support and a surface layer thereon with the surface layer having a plurality of inserts therein. These inserts are preferably made of a material having a coefficient of thermal expansion that is significantly different from that of the material constituting the surface layer.

Another preferred embodiment relates to a method for transferring a thin layer onto a temporary substrate. This method comprises preparing a bonding surface on a temporary substrate of the type described herein; bonding an original substrate to the temporary substrate at a bonding interface; removing part of the original substrate to provide a selected portion of the original substrate on the surface layer; heat treating the bonded substrates to form detachment zones but incomplete overall detachment at the bonding interface due at least in part to expansion of the inserts by the heat treating; and subsequently detaching remaining portions of the interface that are outside of the detachment zones to remove the selected portion of the original substrate from the temporary substrate.

This method advantageously includes strengthening the bonding of the substrates by applying a heat treatment at a temperature that is below that which produces the detachment zones. Also, the selected portion of the original substrate is generally attached to a final substrate prior to removing the selected portion from the temporary substrate.

Yet another preferred embodiment relates to a method for producing a temporary substrate. This method comprises forming a temporary substrate by depositing a first material on a principal part or support to provide a surface layer thereon; etching the surface layer to form cavities therein; depositing a layer of a second material into the cavities and onto the surface layer to form inserts of the second material deposited in the cavities; polishing the deposited layer of the second material until the surface layer is exposed; and depositing a thin layer of additional first material to cover the inserts. As disclosed herein, the second material has a coefficient of thermal expansion that is significantly different from that of the first material.

FIGS. 2-15 illustrate the preferred embodiments of the disclosure.

Figure 2:
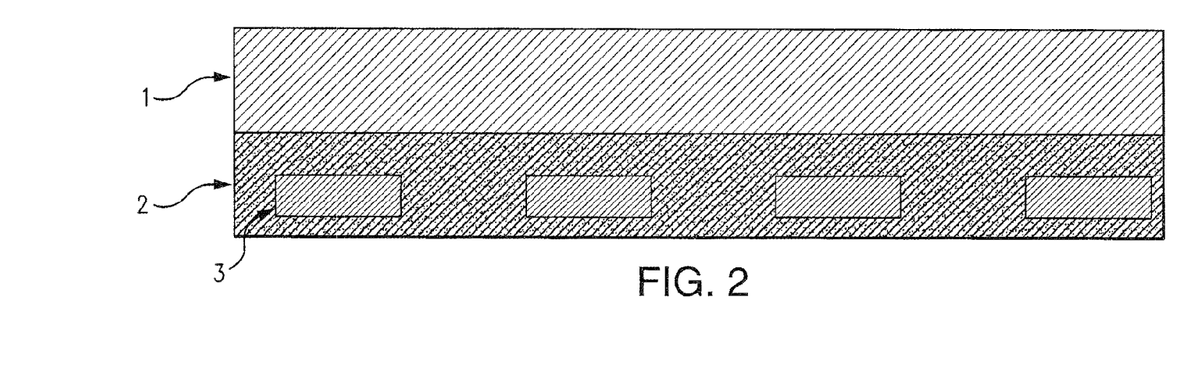
FIG. 2 is a diagram of a cross-section of an embodiment of a temporary substrate according to the first feature of the disclosure.

With reference to FIG. 2, a temporary substrate 100 according to the first feature of the disclosure comprises a surface layer 2, of which the thickness may vary by a few thousands of Å to a few μm. Inserts 3 are arranged in this thin surface layer 2.

The material or materials of the inserts 3 are different from the materials making up the rest of the surface layer 2 and are chosen so as to have significantly different coefficients of thermal expansion (typically, the material of the inserts 3 should have a greater coefficient of expansion than the material of the layer 2). The term "significantly different" means that the coefficient of thermal expansion of the inserts 3 differs by at least 1.5, preferably by at least 2 and more preferably by at least 2.5 times that of the material of the surface layer 2.

Many couples of material may be envisaged, and in a particularly preferred manner, a silicon oxide (especially tetraethoxysilane (TEOS) oxide or a silane) will be taken for the layer 2, and a metal such as copper for the inserts 3. Indeed, a material such as copper has a high thermal conductivity, a tendency to expand (its coefficient of linear expansion a, corresponding, assuming the material to be anisotropic, to the elongation factor of a part for an increase of 1° K, is 16.5× $10^{-6}$, compared with the value $0.6 \times 10^{-6}$ for silicon oxide) and good ductility. Copper is moreover easily electrodeposited. Metal compounds are generally preferably chosen for the inserts 3, but other types of materials may be envisaged such as $Al_2O_3$.

Advantageously, the surface layer 2 covers a principal part 1 or additional layer, which ensures the rigidity of this substrate on account of its much greater thickness than that of the surface layer 2. Typically, the surface layer has a thickness of few thousandths of Å to a few μm, while the support has a thickness of about 100 to 1000 microns. This principal part 1 may consist of all the materials normally used in substrates, notably based on silicon (Si, SiC, SiGe), glass, ceramic or a metal alloy. The choice of material could be made according to constitution of the layer 4 to be transferred, as known and selected by a person skilled in the art.

Preferred geometries for the arrangement of the inserts 3 in the surface layer 2 are described subsequently, it being possible for the inserts 3 to cover, for example, the entire surface of the temporary substrate 100.

Use of the Temporary Substrate for Processing an Original Substrate

A temporary substrate has the function of receiving, in a transient manner, an original substrate (comprising circuits, for example, in a thin upper layer 4) with a view to process it, for instance, to transfer the thin upper layer 4 of the original substrate 5 to a final substrate.

The disclosure thus relates generally, according to a second feature, to a method of processing an original substrate 5 on a temporary substrate 100 such as previously described. The original substrate 5 usually presents a thin upper layer 4 at its upper surface that may comprise microcomponents. The exposed surface of the upper layer 4 has been prepared for facilitating its attachment, as it will be described below. This preparation step may comprise the deposition and planarization of a TEOS encapsulating layer.

Figure 3:
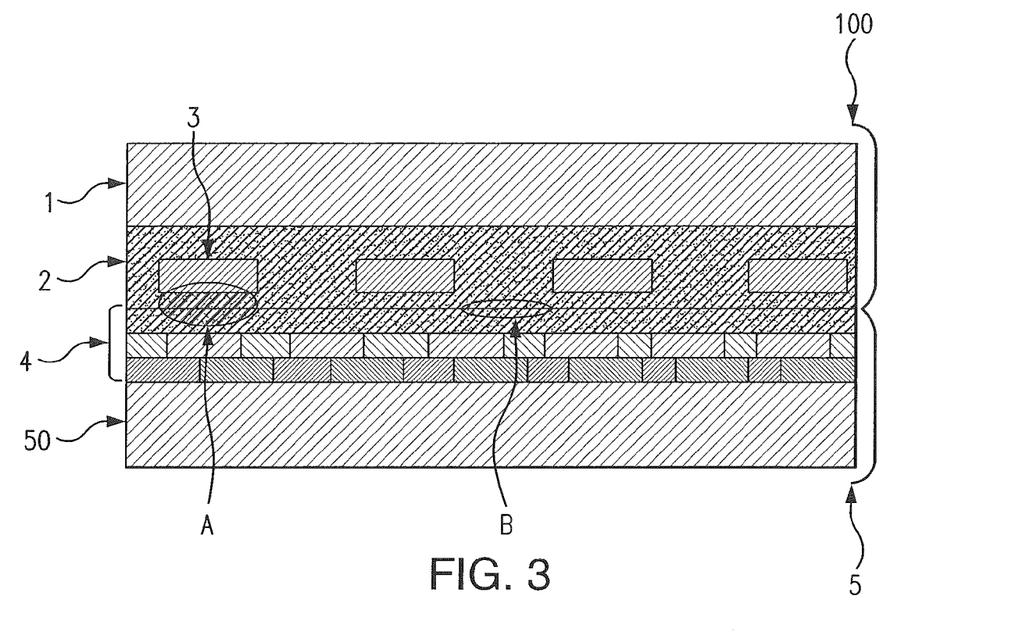
FIGS. 3 to 6 are diagrams of cross-sections of combinations of various substrates during successive steps of an embodiment of a transfer method according to the second feature of the disclosure.
Figure 4:
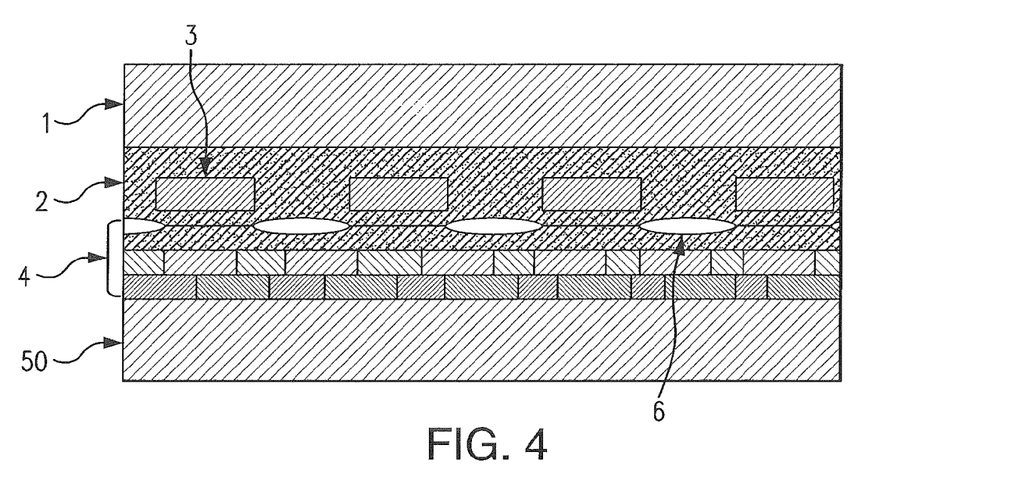

As shown in FIG. 3, the substrate 100 is first of all attached to one of the layer or layers 4 of the original substrate 5 before being transferred (this assembly will subsequently be designated generically as a single layer 4). Any type of attachment may be employed, preferably of a molecular nature, notably an oxide-oxide hydrophilic attachment, in particular, in the case of the use of a TEOS oxide for the surface layer 2. Molecular bonding is preferable in the sense that it does not require any additional adhesive substance for the attachment that may not withstand the required high temperature process. It should be recalled that the principle of molecular bonding is based on bringing two surfaces into direct contact, i.e., without using a specific bonding material (adhesive, wax, solder, etc.). Such an operation requires that the surfaces to be bonded are sufficiently smooth, free from particles or contamination, and that they are brought sufficiently close together to allow contact to be initiated, typically, to a distance of less than a few nanometers. Under such circumstances, forces of attraction between the two surfaces are high enough to cause molecular bonding (bonding induced by the set of attractive forces (van der Waals forces)) due to electrons interacting between atoms or molecules of the two surfaces to be bonded together.

The attachment or bonding step may also preferably comprise a heat treatment to provide sufficient adhesion between the original substrate 5 and the temporary substrate 100. The heat treatment can be between 50° C. to 400° C. from 1 minute to 12 hours and, preferably, between 150° C. and 350° C. for 1 to 5 hours. For instance, in the case of a surface layer 2 and an upper surface of the original substrate 5 in TEOS and copper inserts 3, the heat treatment can be at 250° C. for two hours, allowing it to reach a surface energy of about 600 $mJ/m^2$.

The original substrate 5 is then processed. For instance, a part 50 of the original substrate thickness could be removed, by chemical or mechanical means (e.g., backside thinning, edge grinding, or polishing). In addition or in replacement of the removal step, other processing steps can be performed. It can be the formation of vias or contacts or deposition of functional layers on the exposed face of the original substrate 5.

Figure 5:
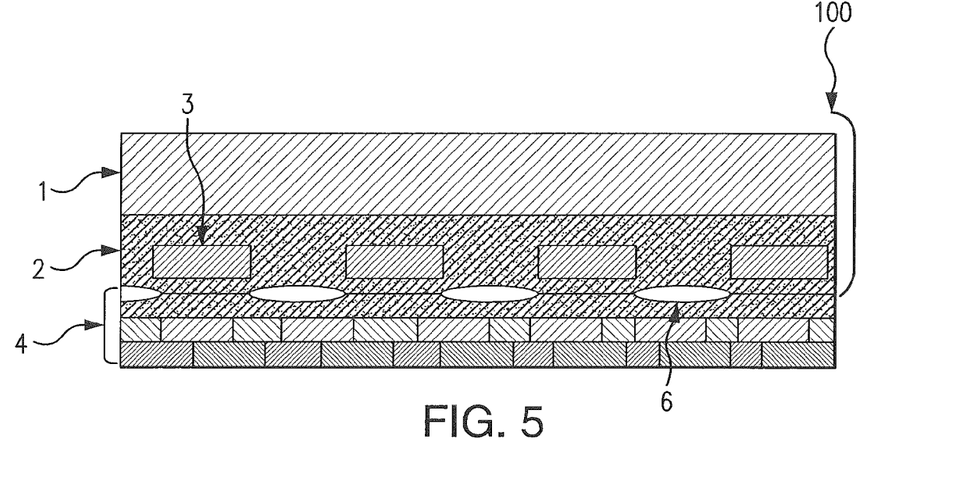

In a particular embodiment of the disclosure that is shown in FIG. 5, the structure obtained is then attached to the final substrate 8, covered as the case may be with one or more layers 7 such as an oxide layer. This attachment step remains optional, in particular, if the remaining part of the original substrate 5 is sufficiently rigid for being self-supported (i.e., to be manipulated without the need of an additional rigid substrate).

A heat treatment is then performed for forming the detachment zone between the upper face of the original substrate 5 and the temporary substrate 100. This heat treatment preferably takes the form of annealing with a temperature ramp that can reach several hundreds of degrees Celsius. For example, in the case of a layer 2 made of silicon oxide and copper inserts 3, the temperature to be reached during heat treatment will preferably lie between 350° C. and 420° C., preferably for at least two hours. This treatment brings about the expansion of the assembly, in particular, the inserts 3 that will experience a substantial increase in thickness relative to that of the rest of the surface layer 2 due to the significantly different coefficient of thermal expansion of the inserts 3. The temperature of the thermal treatment is limited by the maximum temperature that can be applied to the original substrate 5, in particular, if the original substrate 5 comprises components. Typically, microcomponents cannot be exposed to temperatures above 450° C. without risk of degradation. Also, the heat treatment must not be conducted under conditions that cause detachment of the thin layer 4. A suitable heat treatment includes a temperature of 300° C. to 425° C. for 2 to 4 hours.

Various types of interface between the substrate 100 and the layer 4 are present. At the level of zones A, vertically above an insert 3, there is only a very small distance between this insert 3 and the interface. On the other hand, at the level of zones B, the substrate 100 is only made of material of the surface layer 2 over all its thickness. At the level of the zones A, the thermal expansion of the inserts 3 pushes the substrate 1 and thus induces detachment at the level of the zones B with the creation of detachment zones or cavities 6 that may be seen in FIG. 4. These cavities 6 will be larger the lower the attachment energy after the attachment heat treatment. A small distance from the surface of the insert 3 to the attachment interface will also facilitate detachment. Advantageously, this distance, which corresponds to thickness of the material of the surface layer 2 covering the inserts 3, is less than 5000 Å.

Figure 6:
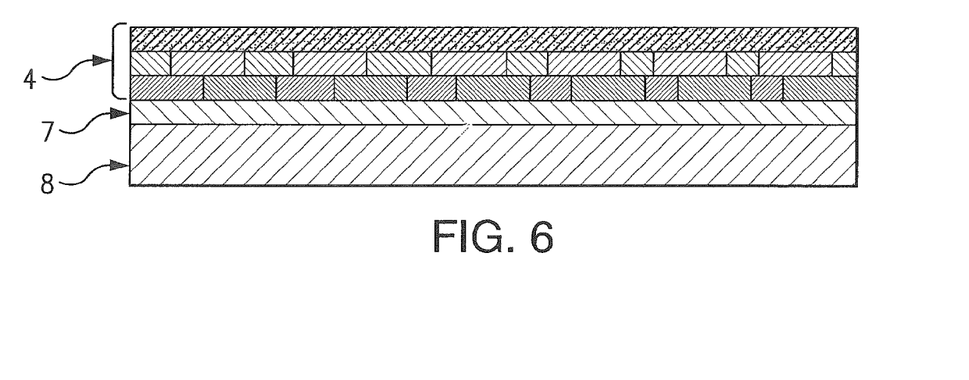

Then, the temporary substrate 100 is withdrawn by a mechanical demounting action at the level of the weakened attachment interface so as to arrive at the final structure that may be seen in FIG. 6. In point of fact, after the demounting heat treatment step, a consequent part of the interface between the temporary substrate 100 and the layer 4 is already detached. Only a fraction of the force to be employed for normal detachment of a conventional temporary substrate is necessary. By adjusting the geometry of the inserts 3, it is possible to control this fraction. This structure makes it possible to have two different levels of attachment and to pass from the first to the second by heat treatment.

In complement, or in substitution of the mechanical demounting action, an etching solution can be introduced at the level of the interface between the temporary substrate 100 and the original substrate 5 (or its remaining part) to etch away part of the surface layer 2 and/or layer 7. The efficiency of the etching solution is facilitated by the presence of the voids thermally induced by the presence of inserts 3 in the surface layer 2.

Advantageously, the inserts 3 are distributed in the surface layer 2 in a regular pattern, in particular, in a checkered pattern, with the inserts 3 having a square section. The disclosure is not, however, in any way limited to this geometry and may take many other forms such as a triangular layout.

In the case of a checkered pattern, it is particularly preferred to separate inserts two-by-two by a distance equivalent to their width, this distance being normally between 250 and 500 µm. The advantages of such geometry will become clearly apparent in FIG. 7. Zones that maintain attachment correspond to zones under the insert 3 and to the zones C that are at the intersection of two bands of unaffected materials of the layer 2, which are then not directly placed between two inserts. The detachment zones 6 cover the rest of the substrate 100. By virtue of the preferred geometry shown, it will be seen that the surfaces of the two zones are equal overall, annealing dividing the adhesion overall by a factor of two.

Figure 7:
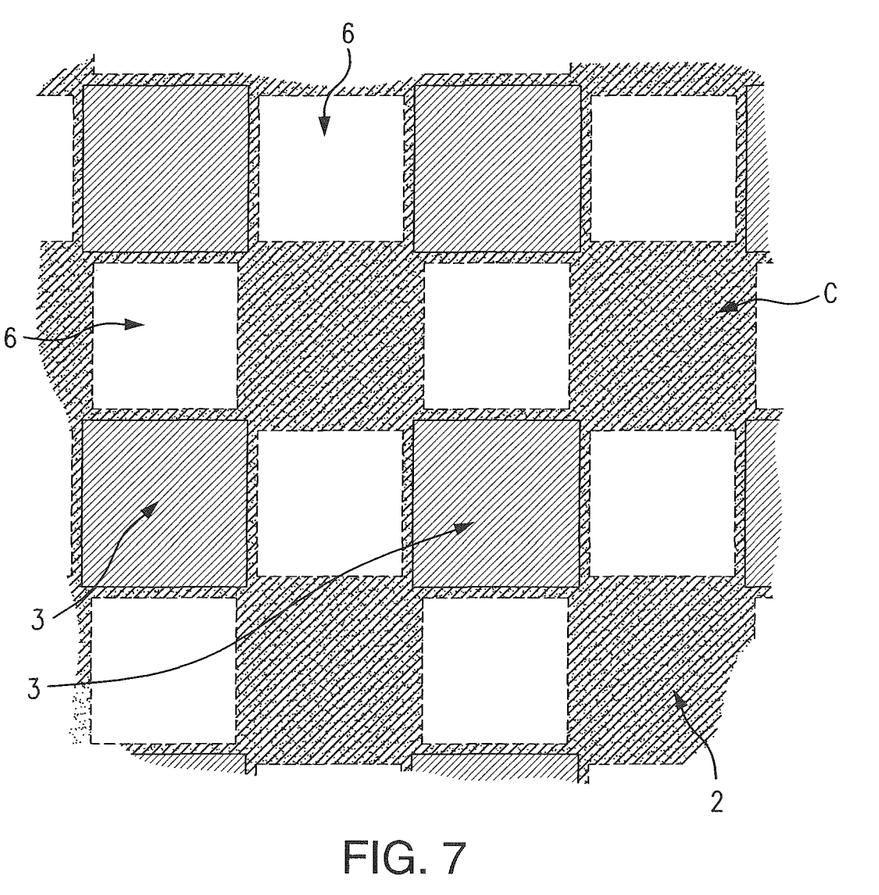
FIG. 7 is a diagram of a sagittal section at the level of an interface between a temporary substrate according to an embodiment of the first feature of the disclosure and a layer to be transferred.
Figure 8:
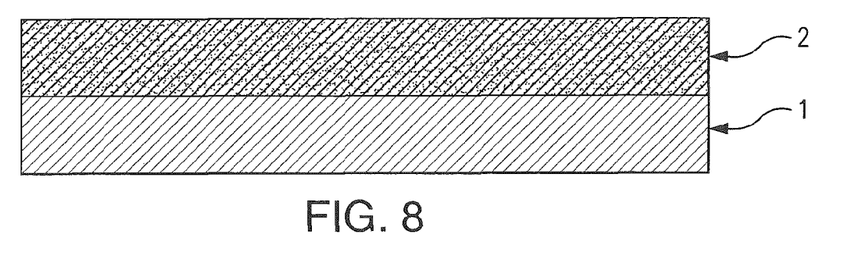
FIGS. 8 to 15 are diagrams of cross-sections of the temporary substrate during successive steps of an embodiment of its production process according to the third feature of the disclosure.

In such a configuration, considering that the coefficient of expansion of silicon oxide is $0.6 \times 10^{-6}$ and that of copper is $16.5 \times 10^{-6}$, that the latter is sufficiently ductile so that all expansion occurs in direction of the attachment interface, and that the thickness of the inserts is 1 µm, detachment of a layer having a thickness of greater than 100 Å is obtained for annealing at 400° C., this dimension corresponding to the height of the cavities 6. In an alternative embodiment, it is possible to perform the detachment heat treatment before the processing of the original substrate 5. As explained above, this treatment will decrease the adhesion of the original substrate 5 to the temporary substrate 100, but this decreased adhesion could, in certain instances, be sufficient to withstand the processing of the temporary substrate 100.

Production of the Temporary Substrate

The disclosure finally relates, according to a third feature, to a method for producing a temporary substrate 100 such as previously described.

The production method, starting from the main bare part 1, commences by a step of depositing the surface layer 2, which may advantageously be carried out by PECVD (plasma-enhanced chemical vapor deposition) if the material is a TEOS oxide or a silane. PECVD is a known method for depositing a thin layer on a substrate from a gaseous state and makes it possible to obtain small thicknesses equal to or even less than a micron that are necessary for the disclosure. The temporary substrate 100 being produced is then in the state shown in FIG. 8.

Figure 9:
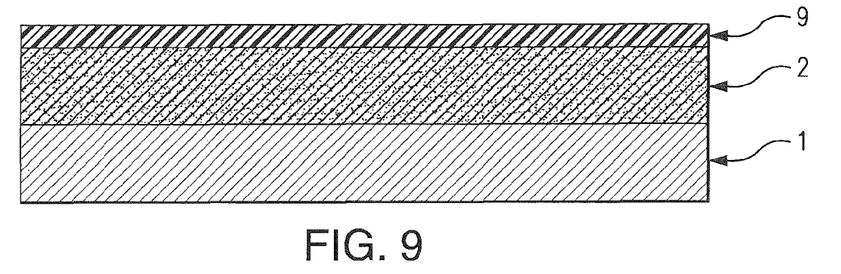
Figure 10:
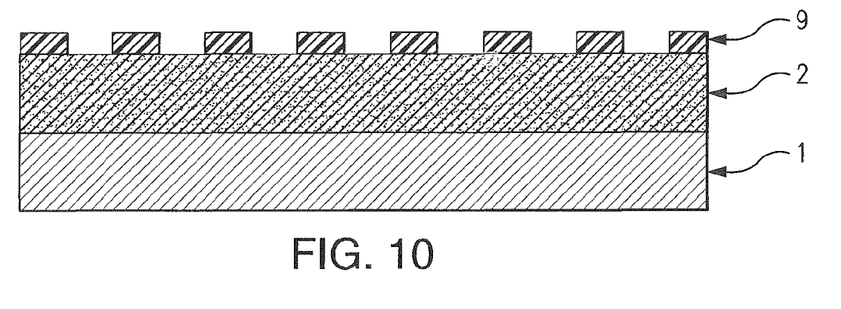
Figure 11:
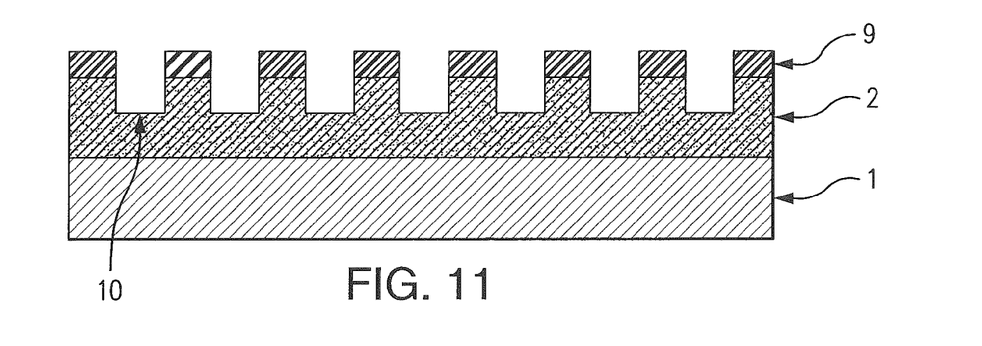
Figure 12:
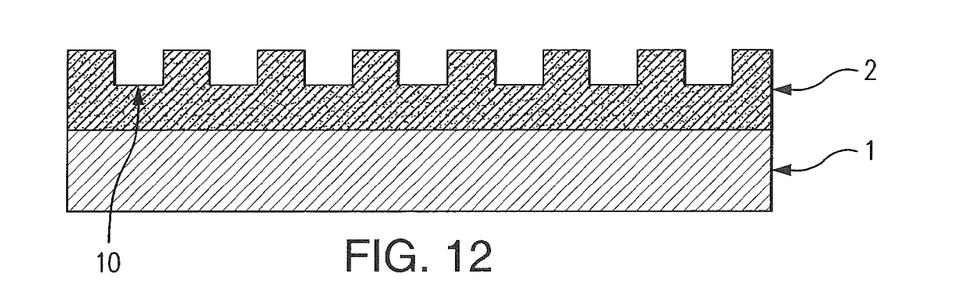

The surface layer 2 is then etched to form cavities 10 that will shelter the inserts 3. Photolithography may be used for this purpose. A photosensitive resin 9 that may be seen in FIG. 9 is deposited and exposed to radiation behind a mask that represents the negative of patterns to be etched (here, the zones that will receive the inserts 3), which is called insulation. The resin 9 is developed, bringing about solution of the exposed parts (FIG. 10). The parts that are not to be etched are then protected by the resin 9, as against the parts to be etched.

Various etching techniques, whether by a dry method (plasma) or a wet method (chemical attack, for example, by hydrofluoric acid), are known to a person skilled in the art. Once the cavities 10 have been etched (FIG. 11), the rest of the photosensitive resin 9 is removed as appropriate. The substrate then has the surface state that may be seen in FIG. 12.

Figure 13:
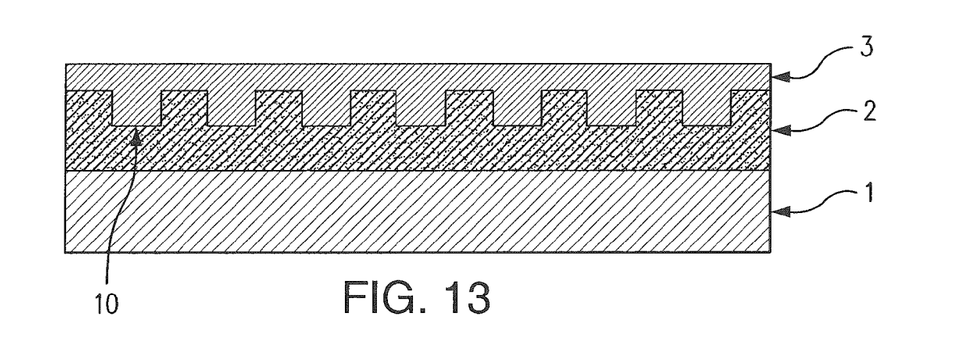
Figure 14:
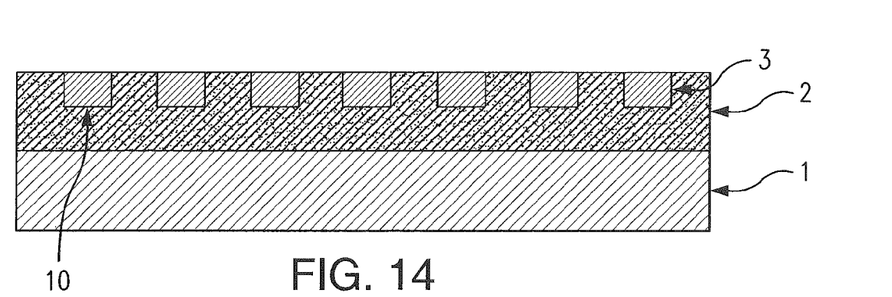
Figure 15:
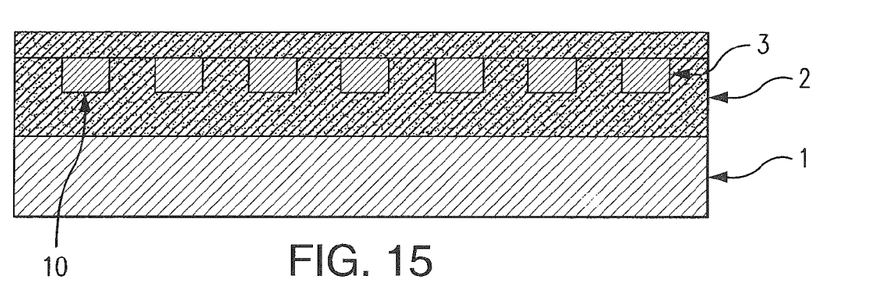

The cavities 10 are then filled with the material constituting the inserts 3. If this is copper, it is quite simply electrodeposited by electrolysis on the surface to slightly overfill the cavities 10 (FIG. 13).

The excess material of the inserts 3 is then removed by mechano-chemical polishing until the material of the surface layer 2 is revealed. All that remains is to cover the inserts 3 at present in place, as may be seen in FIG. 14. To this end, a thin layer of the material of the surface layer 2 is deposited so as to cover the inserts 3, this being once again carried out by PECVD (TEOS or silane). Finally, the surface obtained (FIG. 15) is flattened as required by known methods (mechano-chemical polishing), for instance, to a roughness value less than 1 nm RMS (Root Mean Square), or even 0.5 nm, so as to increase the ability of the surface to be attached against a layer 4 to be transferred.

What is claimed is:

1. A method for transferring a thin layer onto a temporary substrate, the method comprising:
   preparing a bonding surface on a temporary substrate for receiving an additional substrate that will transfer a thin layer, the temporary substrate comprising a principal part and a surface layer thereon with the surface layer having a plurality of inserts therein, wherein the inserts are made of a material having a coefficient of thermal expansion that is significantly different from that of the material constituting the surface layer;
   bonding an original substrate to the temporary substrate at a bonding interface;
   removing part of the original substrate to provide a selected portion of the original substrate on the surface layer;
   heat treating the bonded substrates to form detachment zones but incomplete overall detachment at the bonding interface due at least in part to expansion of the inserts by the heat treating; and
   subsequently detaching remaining portions of the interface that are outside of the detachment zones to remove the selected portion of the original substrate from the temporary substrate.

2. The method of claim 1, wherein the original substrate includes one or more device layers in the selected portion.

3. The method of claim 2, wherein the removing is performed by mechanical or chemical action and results in the provision of a thin layer that includes the one or more device layers.

4. The method of claim 1, wherein the detaching comprises mechanical action.

5. The method of claim 1, wherein the detaching comprises application of a chemical etchant.

6. The method of claim 1, further comprising strengthening the bonding of the substrates by applying a heat treatment at a temperature that is below that which produces the detachment zones.

7. The method of claim 1, further comprising attaching the selected portion of the original substrate to a final substrate prior to removing the selected portion from the temporary substrate.

8. The method of claim 1, wherein the principal part of the temporary substrate is made of a material chosen from at least one of Si, SiC, SiGe, glass, a ceramic, a metal or a metal alloy, and wherein the surface layer completely covers the principal part.

9. The method of claim 1, wherein the surface layer of the temporary substrate is made of a silicon oxide and has a surface roughness below 1 nm.

10. The method of claim 1, wherein the inserts of the temporary substrate are made of copper and are distributed in the surface layer in a regular pattern.

11. The method of claim 10, wherein the inserts of the temporary substrate are distributed in a checkered pattern, and are separated two by two by a distance equivalent to their width, with the width of the inserts or their spacing lying between 250 and 500 μm.

12. The method of claim 1, wherein the inserts of the temporary substrate are covered by a thickness of material of the surface layer that is at least 100 Å but less than 5000 Å.

\* \* \* \* \*

UNITED STATES PATENT AND TRADEMARK OFFICE
CERTIFICATE OF CORRECTION

PATENT NO. : 9,275,888 B2  
APPLICATION NO. : 13/174363  
DATED : March 1, 2016  
INVENTOR(S) : Gregory Riou

Page 1 of 1

It is certified that error appears in the above-identified patent and that said Letters Patent is hereby corrected as shown below:

In the specification:

| | | |
|---|---|---|
| COLUMN 2, | LINE 36, | change "substrate substrate," to --substrate,-- |
| COLUMN 5, | LINE 6, | change "expansion a," to --expansion α,-- |

Signed and Sealed this  
Seventh Day of June, 2016

Michelle K. Lee  
*Director of the United States Patent and Trademark Office*